US009583175B1

(12) United States Patent
Singh et al.

(10) Patent No.: US 9,583,175 B1
(45) Date of Patent: Feb. 28, 2017

(54) RECEIVER EQUALIZATION CIRCUIT WITH CROSS COUPLED TRANSISTORS AND/OR RC IMPEDANCE

(71) Applicant: Integrated Device Technology, Inc., San Jose, CA (US)

(72) Inventors: Praveen Rajan Singh, Alphareatta, GA (US); Yanbo Wang, Duluth, GA (US)

(73) Assignee: INTEGRATED DEViCE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/956,870

(22) Filed: Dec. 2, 2015

(51) Int. Cl.
*G11C 7/10* (2006.01)
*G11C 11/4093* (2006.01)
*G11C 11/4074* (2006.01)
*G11C 11/4091* (2006.01)

(52) U.S. Cl.
CPC ...... *G11C 11/4093* (2013.01); *G11C 11/4074* (2013.01); *G11C 11/4091* (2013.01)

(58) Field of Classification Search
CPC ........................................... G11C 7/10
USPC ..................................... 365/189.05
See application file for complete search history.

(56) References Cited

U.S. PATENT DOCUMENTS

| | | | | |
|---|---|---|---|---|
| 5,343,428 A * | 8/1994 | Pilo | ........................ | G11C 7/062 327/52 |
| 5,986,955 A * | 11/1999 | Siek | ........................ | G11C 7/1006 365/190 |
| 6,639,620 B2 * | 10/2003 | Ishikawa | ........................ | G02B 26/127 347/235 |
| 7,548,094 B2 * | 6/2009 | Shepard | ........................ | G06F 13/4072 326/135 |
| 7,979,039 B2 * | 7/2011 | Sumesaglam | ........................ | H04L 25/028 307/412 |
| 8,301,093 B2 * | 10/2012 | Yoshikawa | ........................ | H03K 3/356017 326/115 |
| 8,872,587 B2 * | 10/2014 | Cheeranthodi | ........................ | H03F 1/086 330/252 |
| 2004/0257121 A1 * | 12/2004 | Hori | ........................ | H03K 5/086 327/65 |
| 2014/0269130 A1 * | 9/2014 | Maeng | ........................ | G11C 7/1084 365/207 |

OTHER PUBLICATIONS

Razavi, Behzad, "The Cross-Coupled Pair—Part III", IEEE Solid-State Circuits Magazine, Winter 2015, pp. 10-13.

* cited by examiner

*Primary Examiner* — Min Huang
(74) *Attorney, Agent, or Firm* — Christopher P. Maiorana P.C.

(57) ABSTRACT

An apparatus includes a first circuit and a second circuit. The first circuit may be configured to (a) buffer write signals presented on a data bus connected between a memory channel and a memory controller, (b) buffer read signals presented on the data bus and (c) condition the write signals. The conditioning may be implemented by (i) converting the write signals to a first differential write signal on a first differential write line and a second differential write signal on a second differential write line and (ii) connecting (a) a negative impedance and (b) a combined resistive and capacitive load between the first and second differential write lines. The second circuit may be configured to (a) convert the first and the second differential write signals to a single-ended write signal and (b) present the single-ended write signal to the data bus.

20 Claims, 9 Drawing Sheets

RECEIVER EQUALIZATION CIRCUIT WITH CROSS COUPLED TRANSISTORS AND/OR RC IMPEDANCE

FIELD OF THE INVENTION

The present invention relates to memory generally and, more particularly, to a method and/or apparatus for implementing a receiver equalization circuit with cross coupled transistors and/or RC impedance.

BACKGROUND OF THE INVENTION

Random access memory (RAM) provides fast, cost-effective, volatile storage for computing devices. The Joint Electron Device Engineering Council (JEDEC) provides memory standards for storage devices. DDR4 SDRAM (double data rate fourth generation synchronous dynamic random-access memory) provides higher module density, lower voltage specifications and higher data rate transfer speeds. DDR4 LRDIMM (load reduced dual in-line memory module) technology uses a distributed buffer approach to implement memory bandwidth efficiencies when scaling to higher capacities and data rate transfer speeds.

Increasing data rate transfer speeds introduces new engineering challenges. To meet the JEDEC standards for data transfer, one of the challenges is to overcome loss in signal strength, and increased cross talk and reflections introduced by various components of the transmission channel (i.e., noise). Continuous time linear equalization (CTLE) is a technique used to boost high frequency signals in a specific range of interest. In traditional implementations, a differential input circuit with resistive and capacitive (RC) degeneration is used. In DDR4 applications, the amount of boosting a circuit gets is limited due to the amount of crosstalk. For most circuit designs, area is an important parameter. The amount of area used for a design impacts competitiveness parameters (i.e., cost effectiveness, power consumption, etc.). Conventional implementations of CTLE circuitry use more area and do not fit within aggressive target area parameters.

It would be desirable to implement a receiver CTLE circuit that minimizes cross talk and/or is implemented using a minimal amount of chip area.

SUMMARY OF THE INVENTION

The present invention concerns an apparatus including a first circuit and a second circuit. The first circuit may be configured to (a) buffer write signals presented on a data bus connected between a memory channel and a memory controller, (b) buffer read signals presented on the data bus and (c) condition the write signals. The conditioning may be implemented by (i) converting the write signals to a first differential write signal on a first differential write line and a second differential write signal on a second differential write line and (ii) connecting (a) a negative impedance and (b) a combined resistive and capacitive load between the first and second differential write lines. The second circuit may be configured to (a) convert the first and the second differential write signals to a single-ended write signal and (b) present the single-ended write signal to the data bus.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing a conditioning circuit that may (i) implement equalization on the write lines of a memory module, (ii) implement a cross coupled transistor pair to provide a negative impedance, (iii) implement an RC impedance, (iv) reduce power consumption, (v) be implemented using a minimum amount of area, (vi) meet JEDEC standards, (vii) condition write signals, and/or (viii) be cost effective to implement.

Figure 1:
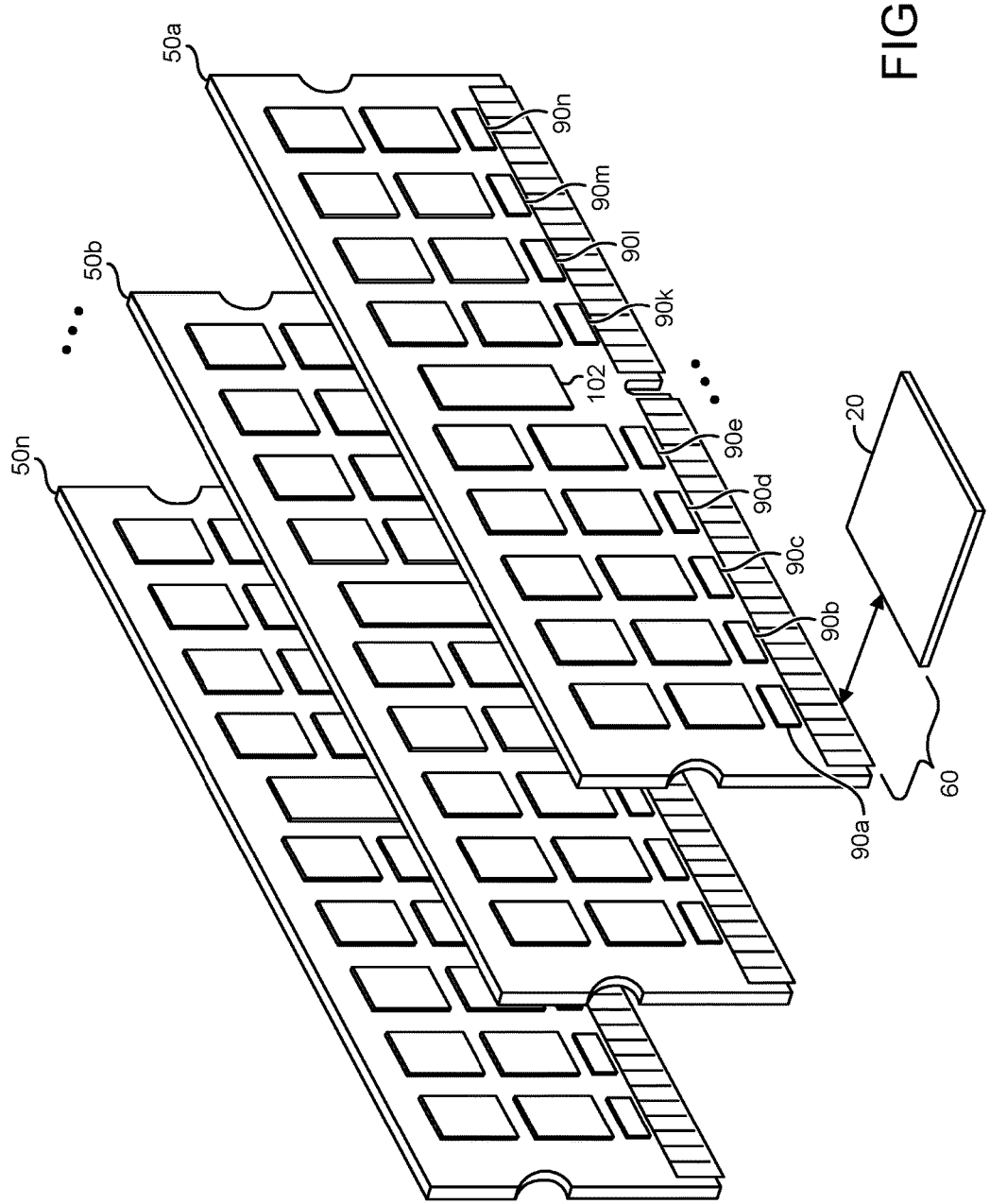
FIG. 1 is a diagram illustrating an example embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 102, and/or various other blocks, circuits, pins, connectors and/or traces. The circuits 90a-90n may be configured as data buffers. The circuit 102 may be implemented as a registered clock driver (RCD). In an example, the RCD circuit 102 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or the memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4

SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
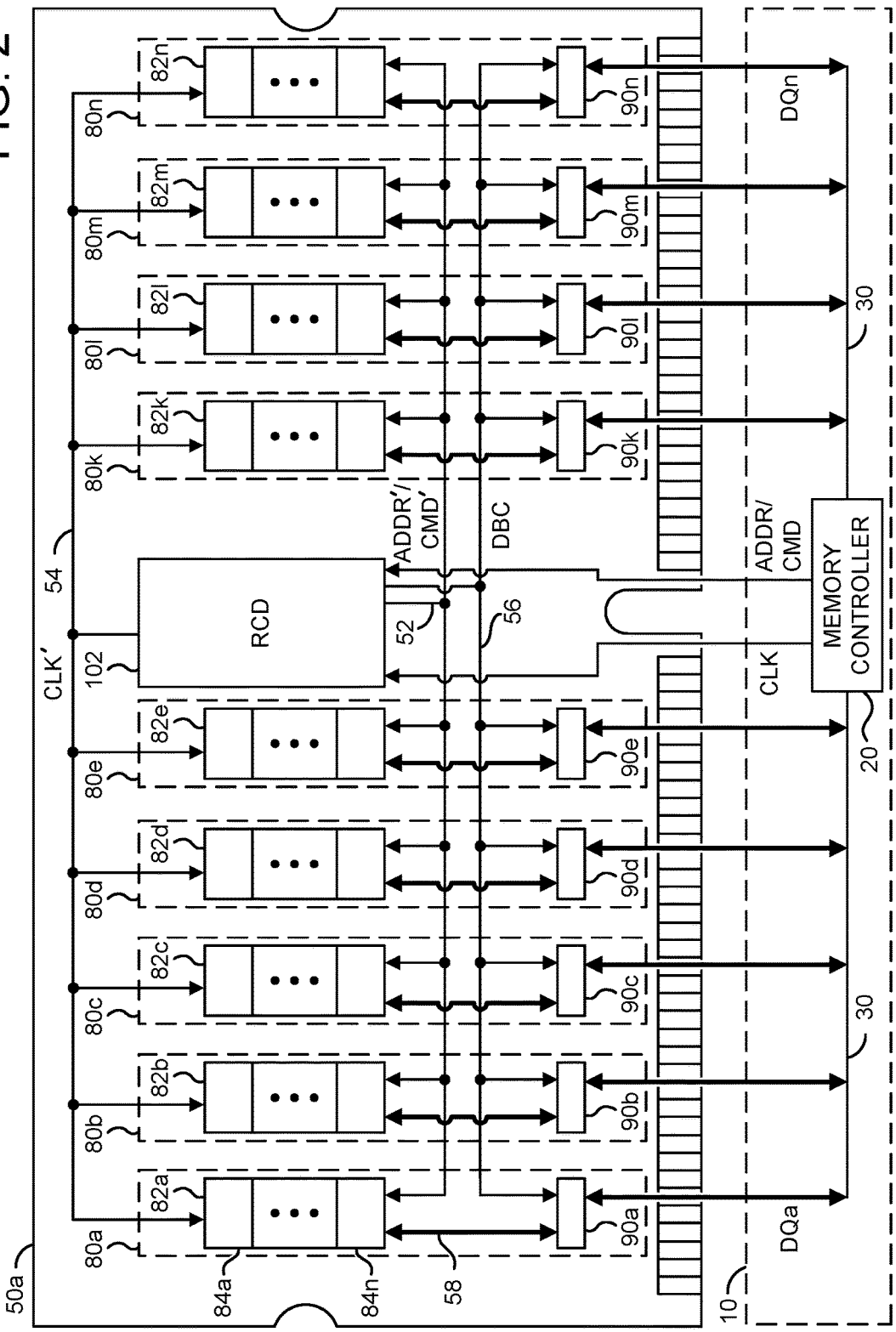
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 102. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 102. A data bus 30 may be connected between the memory controller 20 and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 102 may be configured to communicate with the memory controller 20, the memory channels 82a-82n and/or the data buffers 90a-90n. The RCD circuit 102 may decode instructions received from the memory controller 20. For example, the RCD circuit 102 may receive register command words (RCWs). In another example, the RCD circuit 102 may receive buffer control words (BCWs). The RCD circuit 102 may be configured to train the DRAM chips 84a-84n, the data buffers 90a-90n and/or command and address lines between the memory controller 20. For example, the RCWs may flow from the memory controller 20 to the RCD circuit 102. The RCWs may be used to configure the RCD circuit 102.

The RCD circuit 102 may be used in both LRDIMM and RDIMM configurations. The RCD circuit 102 may implement a 32-bit 1:2 command/address register. The RCD circuit 102 may support an at-speed bus (e.g., a BCOM bus between the RCD circuit 102 and the data buffers 90a-90n). The RCD circuit 102 may implement automatic impedance calibration. The RCD circuit 102 may implement command/address parity checking. The RCD circuit 102 may control register RCW readback. The RCD circuit 102 may implement a 1 MHz inter-integrated circuit ($I^2C$) bus (e.g., a serial bus). Inputs to the RCD circuit 102 may be pseudo-differential using external and/or internal voltages. The clock outputs, command/address outputs, control outputs and/or data buffer control outputs of the RCD circuit 102 may be enabled in groups and independently driven with different strengths.

The RCD circuit 102 may receive the signal CLK and/or the signals ADDR/CMD from the memory controller 20. Various digital logic components of the RCD circuit 102 may be used to generate signals based on the signal CLK and/or the signals ADDR/CMD and/or other signals (e.g., RCWs). The RCD circuit 102 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 102 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84a-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
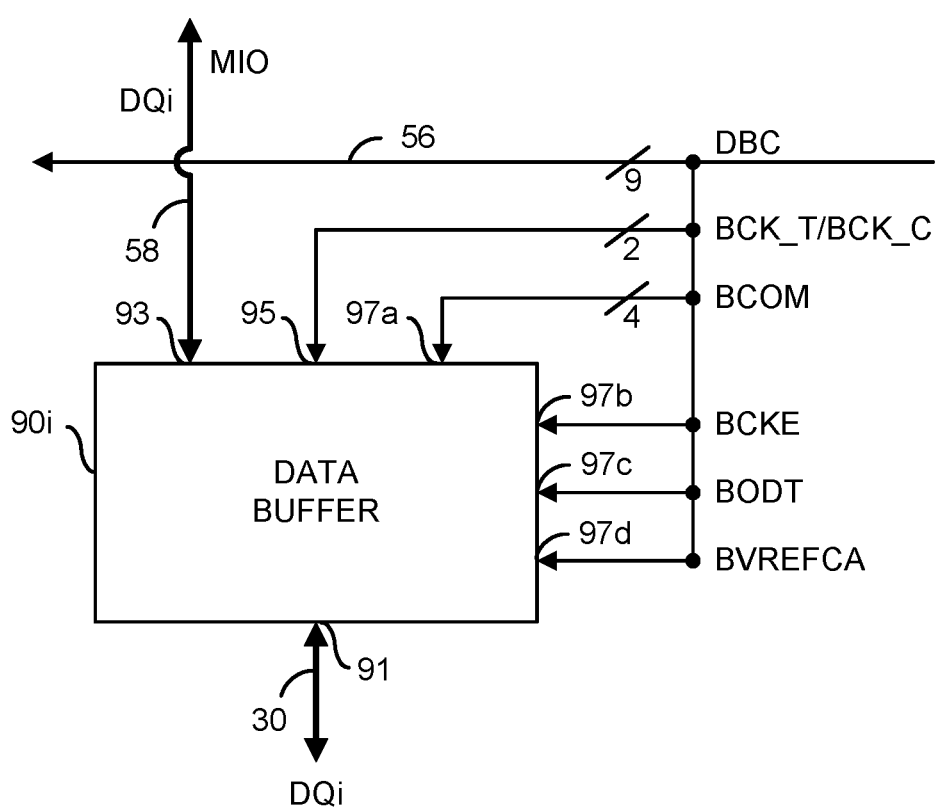
FIG. 3 is a block diagram illustrating input/output for a data buffer.

Referring to FIG. 3, a block diagram illustrating input/output for the data buffer 90i is shown. The data buffer 90i may be representative of the data buffers 90a-90n. The data buffer 90i is shown having an input/output 91 for presenting/receiving the signals DQi (e.g., the data signal DQ corresponding to the data path 80i and/or the data buffer 90i) on the bus 30. The data buffer 90i is shown having an input/output 93 for presenting/receiving one or more signals (e.g., MIO) to the bus 58. The signals MIO on the bus 58 may be transmitted between the DRAM chips 84a-84n and the data buffers 90a-90n. In an example, data from the memory controller 20 may be carried by the signal DQi on the bus 30, presented to the data buffer 90i, buffered in the data buffer 90i, then transmitted on the bus 58 to the memory channel 82i. For example, the bus 58 may transmit a version of the signal DQi (e.g., the signal MIO) between the data buffers 90a-90n and the corresponding memory channels 82a-82n. In another example, data from the memory channel 82i may be carried by the signal DQi on the bus 58, presented to the data buffer 90i, buffered in the data buffer 90i, then transmitted on the bus 30 to the memory controller 20.

The data buffer 90i is shown receiving the signals DBC. The signals DBC may be presented to each of the data buffers 90a-90n (e.g., using the data buffer control bus 56). The signals DBC are shown comprising five signals transmitted over 9 pins/bits (e.g., a signal BCK_T/BCK_C, a signal BCOM, a signal BCKE, a signal BODT and/or a signal BVREFCA). The data buffer 90i is shown having an input 95 for receiving the signals BCK_T/BCK_C, an input 97a for receiving the signal BCOM, an input 97b for receiving the signal BCKE, an input 97c for receiving the signal BODT, and an input 97d for receiving the signal BVREFCA.

The signal BCK_T/BCK_C may be a 2-bit signal representing clocks for the data buffers 90a-90n (e.g., comprised of a differential signal pair). The signal BCOM may be a 4-bit signal representing data buffer command signals (e.g., comprised of four pins/bits). The signal BCOM may be a unidirectional signal from the RCD circuit 102 to the data buffers 90a-90n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (DCKE). The signal BODT may be a function registered dedicated non-encoded signals (DODT). The signal BVREFCA may be a reference voltage for command and control signals.

The data buffers 90a-90n may receive a set of data buffer commands (e.g., buffer control words (BCWs)) from the signals DBC. The buffer control words may be used to customize operation of the data buffers 90a-90n. The buffer control words may flow from the memory controller 20, through the RCD circuit 102, to the data buffers 90a-90n. The buffer control words may be similar to register commands (e.g., register control words (RCW)) used for the RCD circuit 102. Like the register control words (e.g., register commands), the buffer control words (e.g., buffer commands) may look like an MRS7 command, where the address lines are really the payload.

Since the bus 56 is nine pins, the RCD circuit 102 may do more than pass a buffer control word directly through to the data buffers 90a-90n. The RCD circuit 102 may convert (e.g., multiplex) an MRS7 command format into a buffer control word in a BCOM format. The RCD circuit 102 may map the 12 address bits of the MRS7 command into five separate data transfers, each 4 bits wide. The five data transfers may be set up over the bus 56, back to back. For example, 5 clock cycles plus a parity cycle may be used to complete the buffer command in the buffer control word. Once the buffer control word reaches the data buffers 90a-90n, the data buffers 90a-90n may decode the buffer control word, write the buffer control word to a function space of the data buffer, and complete the buffer command in the buffer control word.

A function of the signal BCOM may be to transmit the buffer control words. However, the JEDEC specification for DDR4 SDRAM also specifies that the RCD circuit 102 send all read/write commands and MRS information over the bus 56 (e.g., to allow the data buffers to keep tabs on what the DRAM chips 84a-84n are doing). In some embodiments, different buffer commands may take a different number of cycles to transfer the information.

The RCD circuit 102 may receive an MRS7 command from the memory controller 20 (e.g., from a host). For example, the host 10 may want to change a parameter (e.g., typically on boot up of a computing device). The RCD circuit 102 may check the MRS7 command to determine whether the address bit 12 is set to 1 (e.g., a logical one). When the address bit 12 of the MRS7 command is set to 1, the RCD circuit 102 may recognize the command as a buffer command (e.g., a command that is not meant for the RCD circuit 102). The RCD circuit 102 may convert the command from the memory controller 20 to a buffer control word and send the buffer control word to the bus 56 and then to the data buffers 90a-90n. The data buffer 90i may write the buffer control word to a function space to complete the command.

The data buffers 90a-90n may be configurable. The buffer commands may allow the memory controller 20 to customize aspects of termination, the signal strength on the DQ lines and/or events (e.g., receiver timing, driver timing, etc.) in both directions (e.g., for both read and write operations). In some embodiments, some of the configurations of the data buffers 90a-90n may be decided based on system level configurations. Generally, most of the configuration of the data buffers 90a-90n may be decided during training steps. During training steps, host controllers (e.g., the memory controller 20) may test and compare results of various training steps to determine an optimal configuration.

The bus 56 may be used to send commands/data to program configuration registers of the data buffers 90a-90n. The bus 56 may also send commands (e.g., data reads and/or data writes) that control data traffic through the data buffers 90a-90n. For example, some commands may optimize power consumption of the data buffers 90a-90n. In another example, read/write delays may be added per data line.

The data buffers 90a-90n may implement dual multi-bit (e.g., 4-bit) bidirectional data registers with differential data strobes. The data buffers 90a-90n may implement automatic impedance calibration. The data buffers 90a-90n may implement BCOM parity checking. The data buffers 90a-90n may implement control register buffer control word readback.

Figure 4:
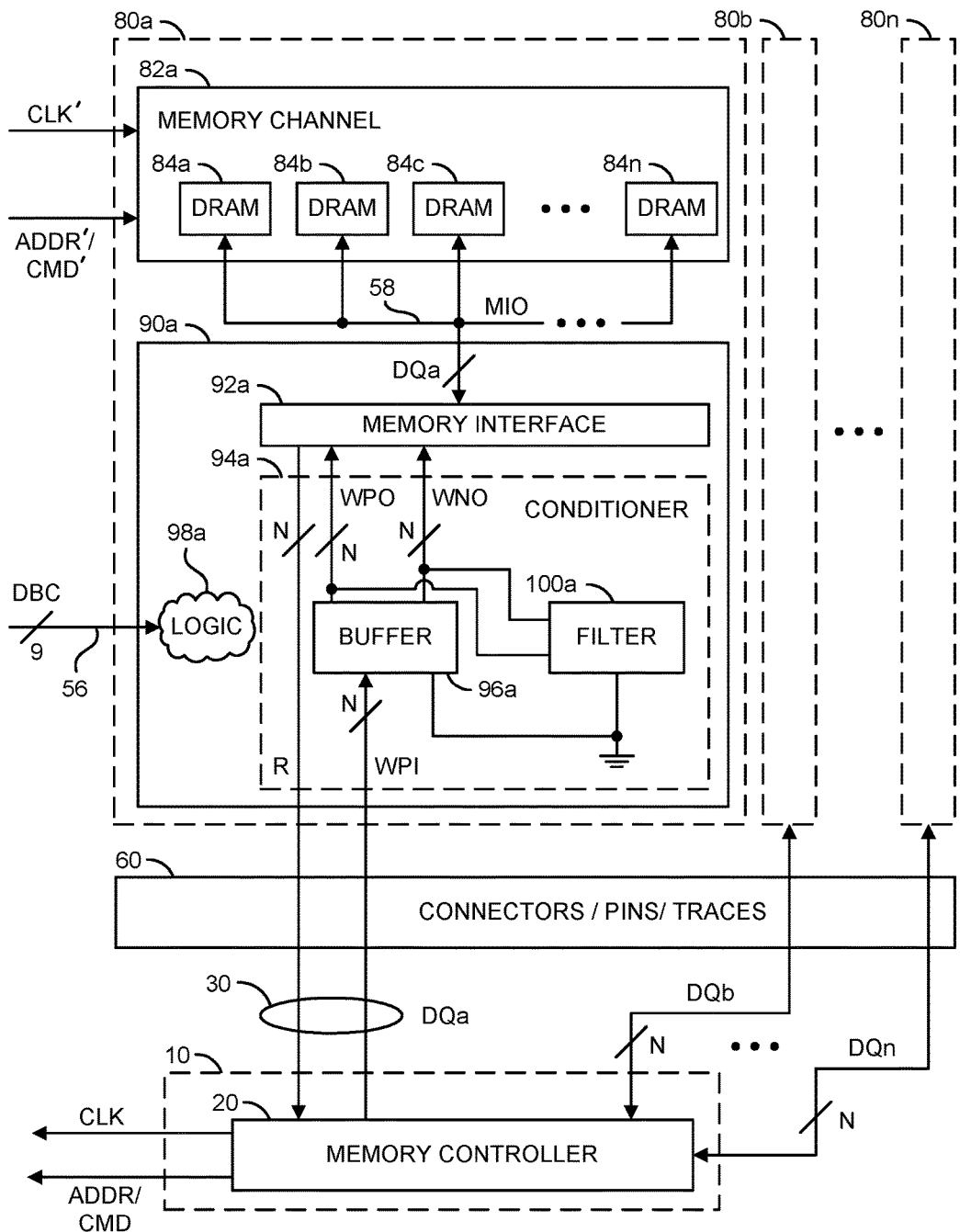
FIG. 4 is a block diagram illustrating a data path.

Referring to FIG. 4, a block diagram illustrating details of the data path 80a is shown. The data paths 80b-80n may have similar configurations. The memory controller 20 is shown generating/receiving the signal DQa over the data bus 30. Similar data signals DQb-DQn may be implemented for the data paths 80b-80n. The data signal DQa may include one or more read signals (e.g., R), and one or more write signals (e.g., WPI). In some embodiments, the write signals may be single-ended signals (e.g., the signal WPI). In some embodiments, the write signals may be implemented as a differential pair. The data signal DQa may include other signals. The composition of the signals comprising DQa may be varied according to the design criteria of a particular implementation. The memory controller 20 may communicate with the data path 80a over the bus 30. The bus 30 may include the connectors/pins/traces 60.

The data buffer 90a may comprise a block (or circuit) 92a, a block (or circuit) 94a, a block (or circuit) 98a and/or input/output pins for the data bus 30 to/from the memory controller 20. The circuit 92a may be implemented as a memory interface. The circuit 94a may be implemented as a conditioner circuit. The data buffer 90a may comprise other logic components circuit 98a. For example, the logic components 98a may receive data from the bus 56. The type, arrangement and/or number of components of the data buffer 90a may be varied according to the design criteria of a particular implementation.

The memory interface 92a may comprise one or more output buffers (not shown). The memory interface 92a may receive the differential write signals (e.g., WPO and WNO) from the conditioner circuit 94a. The differential write signals WPO and WNO generally comprise a differential pair. The write signals WPO and WNO may be transmitted using differential lines (e.g., traces). The memory interface 92a may convert the differential write signals WPO and WNO to a single-ended write signal. The single-ended write signal may be transmitted on the bus 58 (e.g., the signal MIO).

The conditioner circuit 94a may be configured to provide equalization to the write signals WPO and WNO. In certain implementations, the read signal R may not be conditioned. The memory interface 92a may present the conditioned data as a single-ended signal to the memory channel 82a (e.g., to the DRAM chips 84a-84n) over the bus 58. The memory interface 92a may receive the read data from the memory channel 82a (e.g., from the DRAM chips 84a-84n) over the bus 58. The memory interface 92a may present the read data in the signal R to the conditioner circuit 94a. The digital logic 98a and/or other components of the memory interface 92a may be varied according to the design criteria of a particular implementation.

Multiple instantiations of the conditioner circuit 94a may be provided based on a width of the data exchanged with the DRAM chips 84a-84n and a number of sets of DRAM chips 84a-84n. For example, where each DRAM chip 84a-84n exchanges data in 4-bit units (e.g., nibbles) and two sets of DRAM chips 84a-84n are implemented, the width N of the data in the signals WPI, WPO, WNO and R may be eight (e.g., an upper nibble and a lower nibble), and eight instantiations of the conditioner circuit 94a may be implemented.

The conditioner circuit 94a may comprise a block (or circuit) 96a and a block (or circuit) 100a. The circuit 96a may be implemented as a buffer circuit. The circuit 100a may be implemented as a filter. In an example, the circuit 100a may be configured to implement continuous time linear equalization (CTLE). The conditioner circuit 94a may further comprise other components.

The conditioner circuit 94a may receive the write signal WPI. The data buffer 90a may be configured to internally generate a reference signal (e.g., VREF). The signal WPI and the signal VREF may be used to generate the differential write signals WPO and WNO from the single ended signal WPI. The differential write signals WPO and WNO may be conditioned versions of the signal WPI. The differential write signals WPO and WNO may convey the write data signals DQa. In some embodiments, the conditioner circuit 94a may receive the read signal R from the memory interface 92a and present the read signal R to the memory controller 20 via the connectors/pins/traces 60.

The buffer 96a may receive the signal WPI and the internally generated reference signal VREF. In some embodiments, the buffer 96a may receive a differential input (e.g., the signal WPI and a signal WNI (not shown)). The signals WPI and WNI may be a differential signal pair (e.g., the signal WNI may be received instead of the signal VREF). The buffer 96a may present the differential signals WPO and WNO. The filter 100a may generate the conditioned differential write signals WPO and WNO.

In an example, the conditioning performed by the filter 100a may boost high frequency components of the write signals WPO and WNO. The particular amount of crosstalk (e.g., noise) between the signal WPO and the signal WNO may present a practical limit the amount of boosting that may be applied. The filter 100a may increase an amount of the amplitude of the differential write signals WPO and WNO. The amplitude may be increased without an increase in an amount of crosstalk and/or reflections (e.g., noise). The conditioner circuit 94a may present the differential signals WPO and WNO to the interface 92a. The interface 92a may convert the differential signals WPO and WNO back to the single-ended data signal DQa.

Figure 5:
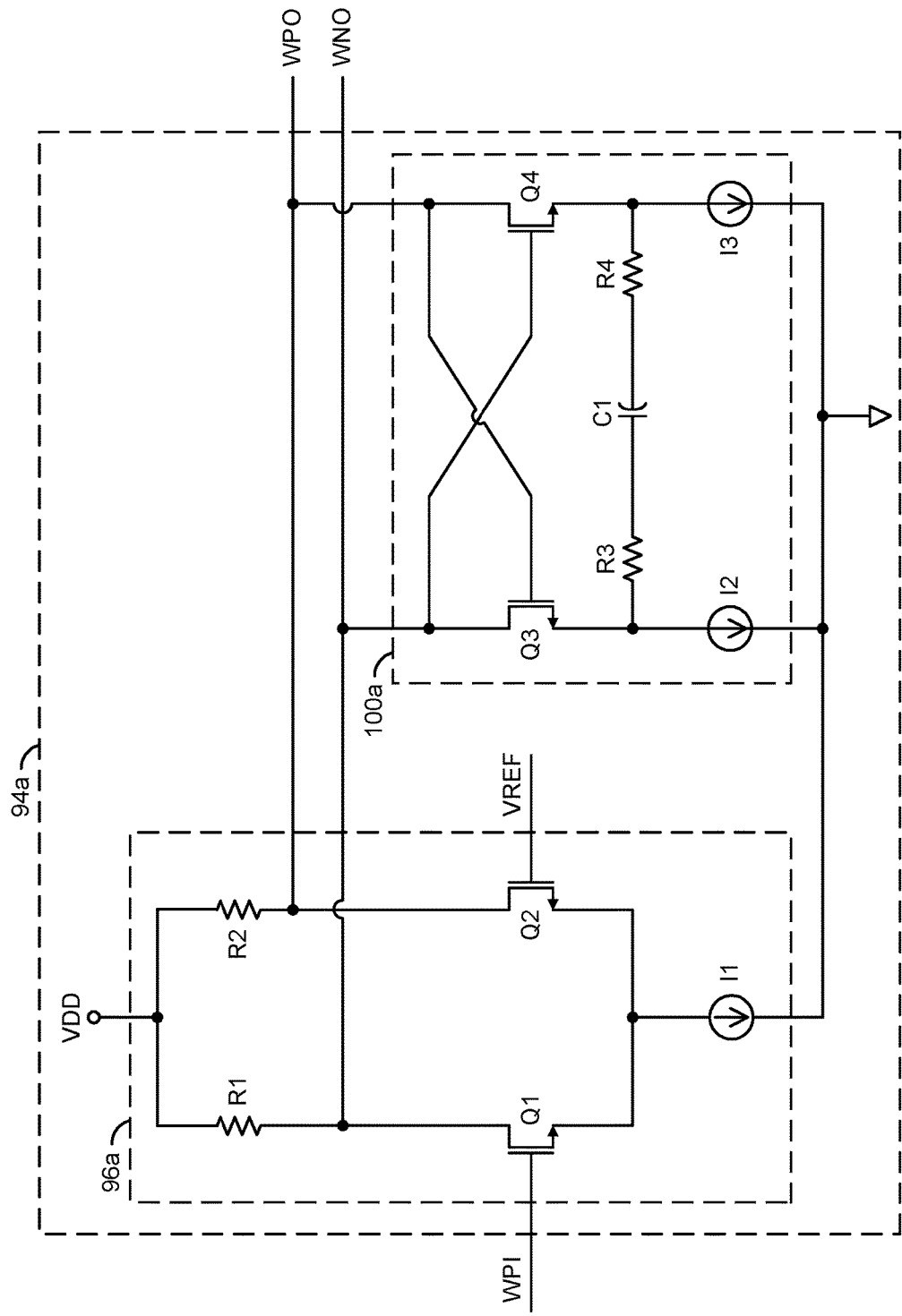
FIG. 5 is a block diagram illustrating a conditioner circuit.

Referring to FIG. 5, a block diagram illustrating details of the conditioner circuit 94a is shown. The buffer 96a is shown comprising a resistor (e.g., R1), a resistor (e.g., R2), a transistor (e.g., Q1), a transistor (e.g., Q2), and a current source (e.g., I1). The transistor Q1 may receive the signal WPI. The transistor Q2 may receive the signal VREF. The signal VREF may be a reference voltage internally driven by the data buffers 90a-90n.

The circuit 100a generally comprises a transistor (e.g., Q3), a transistor (e.g., Q4), a resistor (e.g., R3), a resistor (e.g., R4), a capacitor (e.g., C1), a current source (e.g., I2), and a current source (e.g., I3). The resistor R3 may form a resistance. The resistor R4 may form a resistance. The capacitor C1 may form a capacitance. The particular implementation of the resistor R3, the resistor R4, and the capacitor C1 may be varied to meet the design criteria of a particular implementation. For example, a target resistance may be implemented using a number of the resistors R3 and a number of the resistors R4. A target capacitance may be implemented as a number of the capacitors C1.

Figure 6:
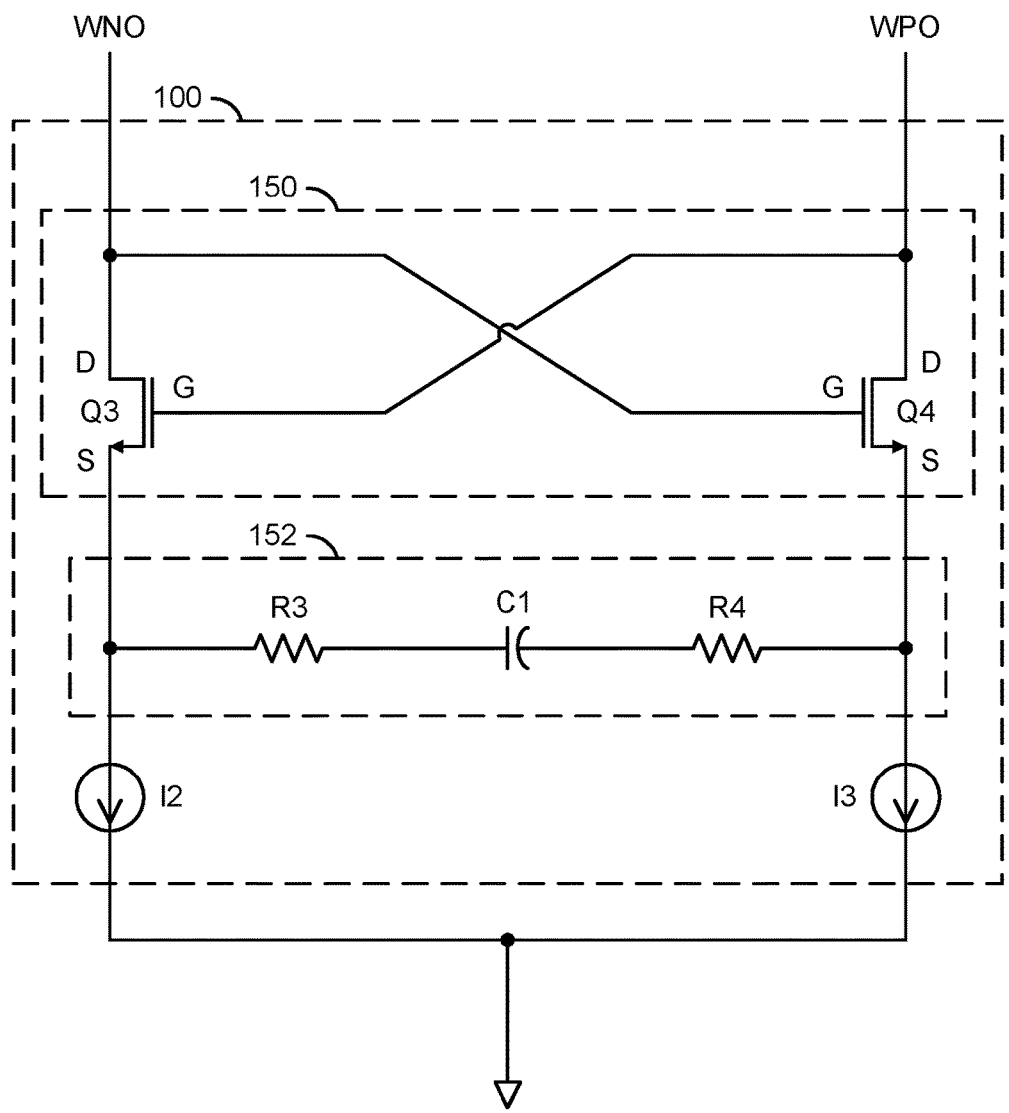
FIG. 6 is a block diagram illustrating a filter.

Referring to FIG. 6, a black diagram illustrating details of the filter 100 is shown. The filter 100 may comprise a block (or circuit) 150 and/or a block (or circuit) 152. The circuit 150 may comprise the transistor Q3, the transistor Q4 and/or other components. The circuit 150 may implement a negative impedance. A gate of the transistor Q3 is shown connected to a drain of the transistor Q4. A gate of the transistor Q4 is shown connected to the drain of the transistor Q3. The drain of the transistor Q3 is shown connected to the differential line transmitting the differential write signal WNO. The drain of the transistor Q4 is shown connected to the differential write line transmitting the differential write signal WPO. The transistor Q3 and the transistor Q4 generally form a cross coupled configuration. The transistor Q3 and the transistor Q4 generally implement a negative impedance.

The circuit 152 may comprise the resistor R3, the capacitor C1 and the resistor R4 and/or other components. The circuit 152 may implement a resistive and capacitive load. The resistor R3, the capacitor C1, and the resistor R4 may be connected between (or in parallel with) the source of the transistor Q3 and the source of the transistor Q4. The current source I2 may be connected between the source of the transistor Q3 and ground. The current source I3 may be connected between the source of the transistor Q4 and ground.

The filter 100 may combine the cross coupled transistors Q3 and Q4 with the resistors R3, R4 and the capacitor C1. The circuit 152 may allow independent control of the load slew rate and/or small signal responses. For example, the filter 100 may independently control a peaking and/or a slewing. The negative impedance circuit 150 and the combined resistive and capacitive load circuit 152 may be connected between the differential lines transmitting the differential write signals WPO and WNO.

The cross coupled transistor pair Q3 and Q4 may be used as a negative impedance converter (NIC). When combined with capacitance and/or resistance loading, the filter 100 may comply with aggressive area and/or power specifications. The filter 100 may reduce an area and/or power parameter for conditioning the various write signals (e.g., WPO, WNO, MIO, etc.) transmitted between the memory channel 82 and the memory controller 20. In general, a customer supplied specification may provide a target power consumption parameter. Area parameters are generally left to the supplier. However, reducing the area parameter and/or the power consumption parameter may reduce the overall cost of manufacturing the component and/or may improve the marketability of a product or component. For example, the filter 100 may reduce the overall area used to implement conditioning of the write signals WPO and/or WNO. The reduction in area may allow the implementation of a cost-effective DDR4 SDRAM module and/or may provide a reduction of the overall power consumed.

Various combinations of loads may be implemented in the circuit 100. In some embodiments, a capacitive load in the circuit 152 (e.g., without the resistors R3 and/or R4) may be implemented. For example, a capacitive load may be implemented for applications where small signal bandwidth for the signals WPO and/or WNO should match and where the target current is small. In an example, slewing (e.g., a large signal phenomenon) may prevent and/or inhibit an effectiveness of combining the circuit 150 with a capacitive load. Combining resistance (e.g., the resistors R3 and/or R4) with capacitance (e.g., the capacitor C1) in the circuit 152 may reduce and/or eliminate slewing. For example, the combined resistive and/or capacitive load may be implemented to achieve specified bandwidth and/or transient waveform parameters.

The filter 100 may implement a cross coupled transistor load with a RC loading at the output (e.g., on the signals WPO and WNO) to implement CTLE. In some embodiments, the resistance and/or capacitance in the circuit 152 may be interchangeable in the load. In some embodiments, the circuit 152 may be implemented using multiple parallel elements. For example, one parallel element may implement the resistance R3, another parallel element may implement the capacitance C1 and another parallel element may implement the resistance R4. The arrangement, value and/or number of the resistive elements, the capacitive elements and/or any other elements in the load circuit 152 may be varied according to the design criteria of a particular implementation.

Figure 7:
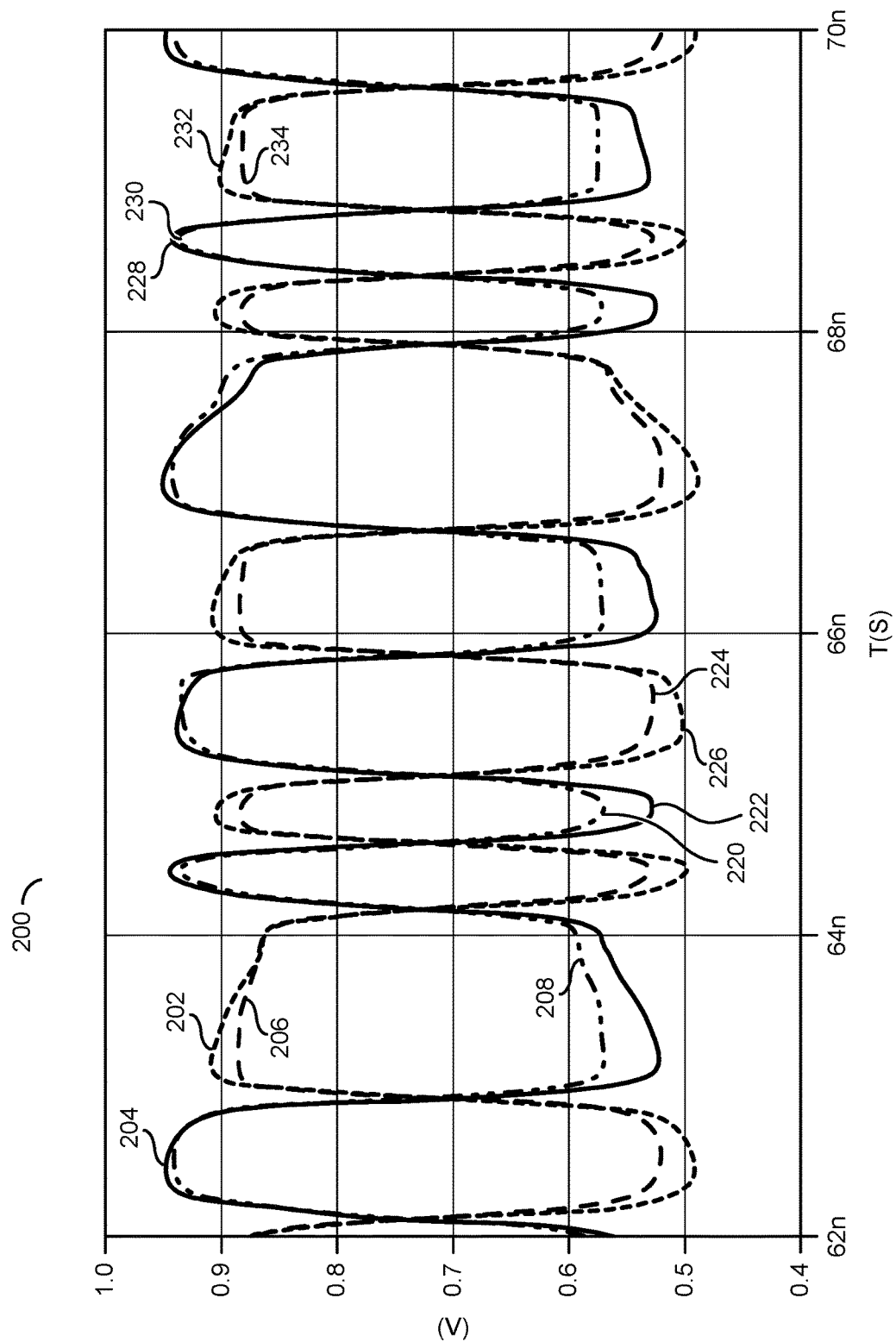
FIG. 7 is a graph illustrating several write signals.

Referring to FIG. 7, a graph 200 is shown. The graph 200 may illustrate a voltage response of several write signals over time. An x-axis of the graph 200 may represent time (e.g., measured in seconds) in a range of 62 nanoseconds to 70 nanoseconds. A y-axis of the graph 200 may represent a voltage of a signal.

The graph 200 shows a line 202, a line 204, a line 206 and a line 208. The lines 202-208 may represent various signals. The line 202 may represent a simulation of the differential signal WPO conditioned by the circuit 100. The line 204 may represent a simulation of the differential signal WNO conditioned by the circuit 100. The line 206 may represent a simulation of the differential signal WPO that has not been conditioned by the circuit 100. The line 208 may represent a simulation of the signal WNO that has not been conditioned by the circuit 100.

The circuit 100 may increase (e.g., boost) the signals WPO and WNO more than increasing the noise (e.g., improve the signal to noise ratio). The signal 202 and the signal 204 (e.g., the signals WPO and WNO conditioned by the circuit 100) are shown generally having a wider range than the corresponding signals 206 and 208 (e.g., the signals WPO and WNO not conditioned by the circuit 100). For example, the signal 202 is shown having a range from approximately 0.91V to 0.49V (e.g., a range of 0.42V) while the corresponding signal 206 is shown having a range from approximately 0.88V to 0.52V (e.g., a range of 0.36V). In another example, the signal 204 is shown having a range from approximately 0.95V to 0.52V (e.g., a range of 0.43V) while the corresponding signal 208 is shown having a range from approximately 0.94V to 0.58V (e.g., a range of 0.36V). The signal 202 and the signal 204 may have a higher signal to noise ratio than the signals 206 and 208.

A point 220 is shown illustrating a low portion of one of the waves of the signal 208. A point 222 is shown illustrating a low portion of one of the waves of the signal 204. A point 224 is shown illustrating a low portion of one of the waves of the signal 206. A point 226 is shown illustrating a low portion of one of the waves of the signal 202. A point 228 is shown illustrating a high portion of one of the waves of the signal 204. A point 230 is shown illustrating a high portion of one of the waves of the signal 208. A point 232 is shown illustrating a high portion of one of the waves of the signal 202. A point 234 is shown illustrating a high portion of one of the waves of the signal 206.

In an example, at the point 222, the low portion of the signal 204 is shown having an absolute value of the amplitude greater than an absolute value of the amplitude of the low portion of the signal 208 at the point 220. Similarly, at the point 226, the low portion of the signal 202 is shown having an absolute value of the amplitude greater than an absolute value of the amplitude of the low portion of the signal 206 at the point 224. In another example, at the point 228, the high portion of the signal 204 is shown having a higher absolute value of the amplitude than the absolute value of the high portion of the signal 208 at the point 230. Similarly, at the point 232, the high portion of the signal 202 is shown having a higher absolute value of the amplitude than the high portion of the signal 206 at the point 234. Overall, the signal 202 and the signal 204 have a greater range and/or amplitude when compared to the signals 206 and/or 208.

Figure 8:
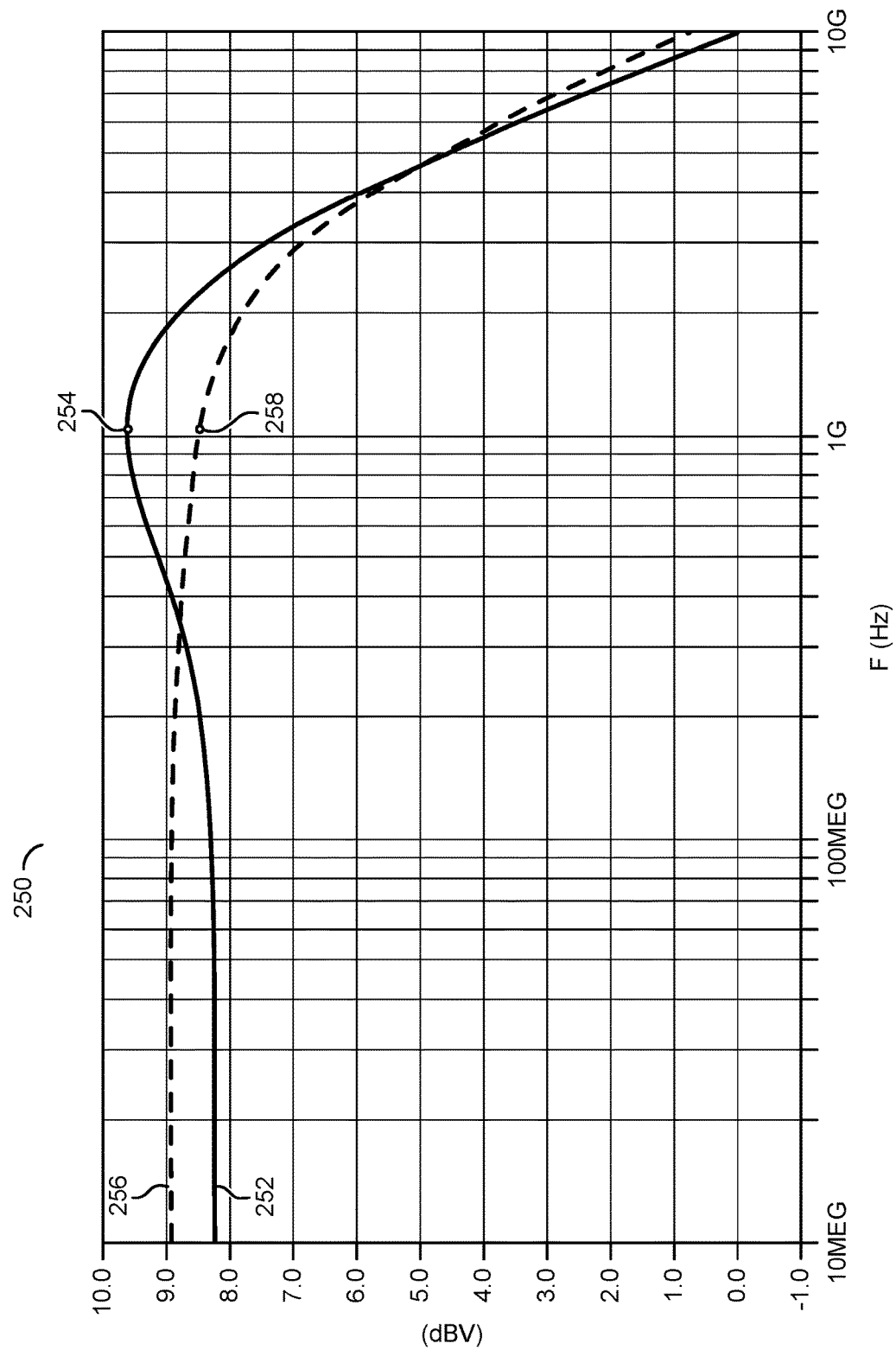
FIG. 8 is a graph illustrating an AC response of differential write signals.

Referring to FIG. 8, a graph 250 is shown. The graph 250 may illustrate an AC response of the differential write signals WPO and WNO. An x-axis of the graph 250 may represent frequency (e.g., measured in Hertz) over a range of 10 MHZ to 10 GHz. A y-axis of the graph 250 may represent a voltage measurement of a signal in voltage decibels (dBV).

The graph 250 is shown having a line 252, a point 254, a line 256 and a point 258. The line 252 may represent a simulation of the differential write signals WPO and WNO that have been conditioned by the circuit 100. The line 256 may represent a simulation of the differential write signals WPO and WNO that have not been conditioned by the circuit 100. The point 254 may represent a point on the line 252. The point 258 may represent a point on the line 256.

The circuit 100 may be configured to control a peak of the differential write signals WPO and WNO. For example, the circuit 100 may allow a boost of the high frequency components of the differential write signals WPO and WNO without a corresponding increase in noise. The point 254 may represent a peak of the line 252. The point 254 may be approximately 9.5 dBV at 1 GHz. The point 258 may be a corresponding point at approximately 1 GHz on the line 252. The point 258 may be approximately 8.5 dBV at 1 GHz. Without the circuit 100, the line 256 shows how the high frequency components are not boosted.

Figure 9:
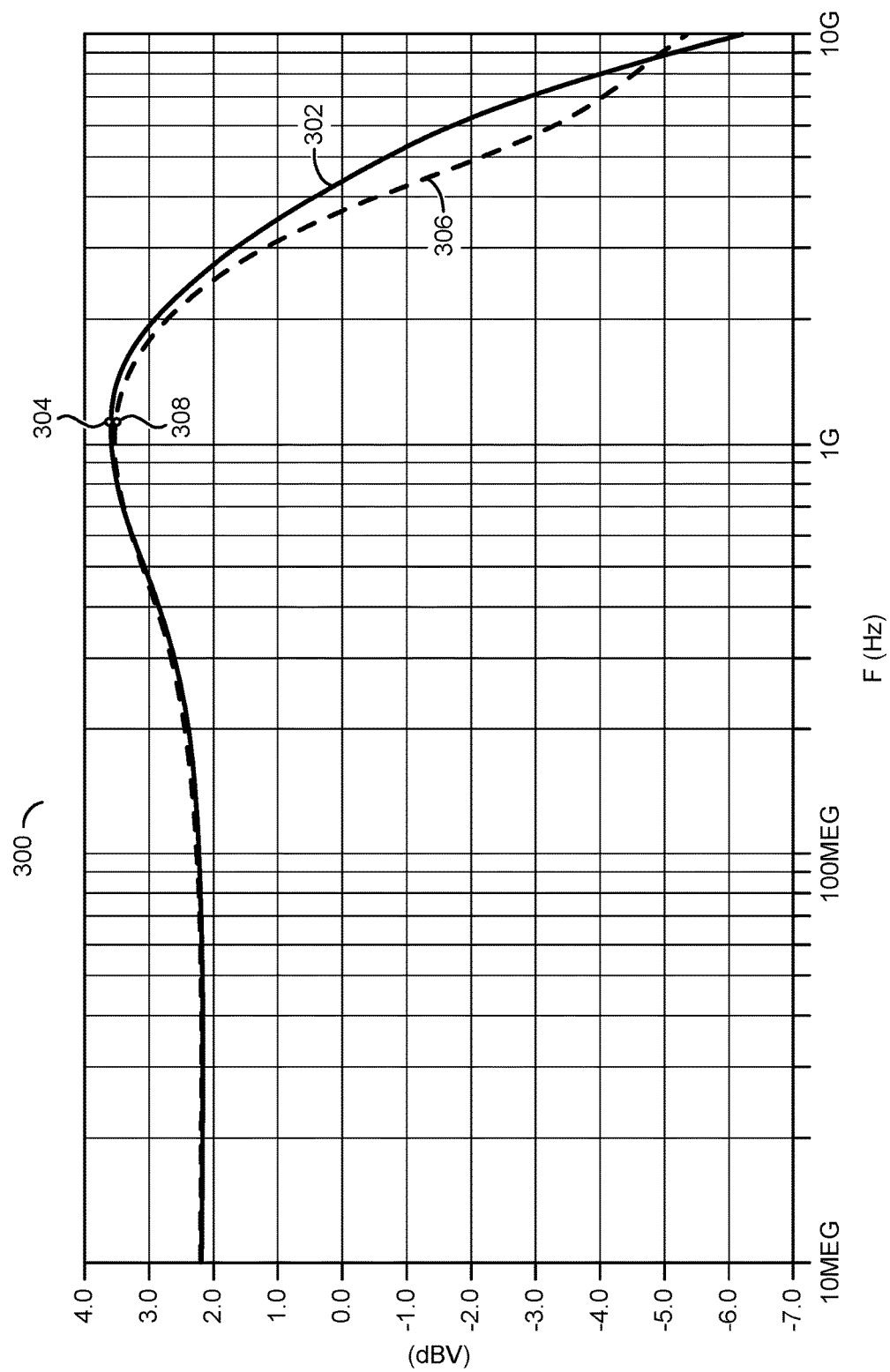
FIG. 9 is a graph illustrating the AC response of the differential write signals.

Referring to FIG. 9, a graph 300 is shown. The graph 300 may illustrate a differential stage AC response of the signals WPO and WNO. An x-axis of the graph 300 may represent frequency (e.g., measured in Hertz) over the range of 10 MHZ to 10 GHz. A y-axis of the graph 300 may represent a voltage measurement of a signal in voltage decibels.

The graph 300 may comprise of a line 302, a point 304, a line 306 and a point 308. The line 302 may represent the differential signal WPO when the differential signals WPO and WNO have been conditioned by the circuit 100. The line 304 may represent the differential signal WNO when the differential signals WPO and WNO have been conditioned by the circuit 100. The point 304 may represent a peak of the line 302. The point 308 may represent a peak of the line 306.

The circuit 100 may be configured to control the amplitude of the peaks 304 and/or 308 of the differential signals WPO and WNO. For example, the circuit 100 may allow a boost of the high frequency components of the differential signals WPO and WNO without a corresponding increase in noise. The peak 304 may be approximately 3.5 dBV at 1 GHz. The peak 308 may be approximately 3.5 dBV at 1 GHz. The frequency response of the differential signals WPO and/or WNO may be similar.

In some embodiments, the data buffers 90a-90n, the conditioner circuits 94a-94n and/or the filter 100 may be implemented to condition write signals transmitted from the memory controller 20 to a corresponding one of the memory channels 80a-80n (e.g., in DDR4 memory applications). In some embodiments, the data buffers 90a-90n, the conditioner circuits 94a-94n and/or the filter 100 may be implemented in signal integrity products. In some embodiments, the data buffers 90a-90n, the conditioner circuits 94a-94n and/or the filter 100 may be implemented as a portion of a command buffer. In some embodiments, the data buffers 90a-90n, the conditioner circuits 94a-94n and/or the filter 100 may be implemented to improve a receiver margin testing (RMT) parameter. The application using the data buffers 90a-90n, the conditioner circuits 94a-94n and/or the filter 100 may vary according to the design criteria of a particular implementation.

While FIG. 4 shows the conditioner circuit 94a in the context of the data buffer circuit 90a receiving write data during write cycles, copies of the conditioner circuits 94a-94n may be implemented at other locations, other data paths and/or other control paths. In various embodiments, copies of the conditioner circuits 94a-94n may be located at the other end of the data bus 30 to improve various signals received by the host circuit 10 during read cycles. For example, the memory controller 20 may include copies of the conditioner circuits 94a-94n to condition the read data received in the signals DQa-DQn from the memory modules 50a-50n. In another example, other copies of the conditioner circuits 94a-94n may be implemented in the memory controller 20 to condition other signals received from the data bus 30. Instances of the conditioner circuit 94a-94n may also be implemented in other circuitry within the memory modules 50a-50n. For example, copies of the conditioner circuits 94a-94n may be included in the RCD circuit 102 to condition address, command data and/or clocking signals received across the data bus 30.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

While the invention has been particularly shown and described with reference to the preferred embodiments thereof, it will be understood by those skilled in the art that various changes in form and details may be made without departing from the scope of the invention.

The invention claimed is:
1. An apparatus comprising:
  a first circuit configured to (a) buffer write signals presented on a data bus connected between a memory channel and a memory controller, (b) buffer read signals presented on said data bus and (c) condition said write signals, wherein said conditioning is implemented by (i) converting said write signals to a first differential write signal on a first differential write line and a second differential write signal on a second differential write line and (ii) connecting (a) a negative impedance and (b) a series combined resistive and capacitive load between said first and said second differential write lines; and
  a second circuit configured to (a) convert said first and said second differential write signals to a single-ended write signal and (b) present said single-ended write signal to said memory channel.
2. The apparatus according to claim 1, wherein (i) said negative impedance is generated by a first transistor and a second transistor in a cross coupled configuration, (ii) a source of said first transistor and a source of said second transistor are connected to respective current sources and (iii) said apparatus has a smaller area than in a DDR3 application.
3. The apparatus according to claim 2, wherein said cross coupled configuration comprises (i) a gate of said first transistor connected to a drain of said second transistor and said second differential write line, and (ii) a gate of said second transistor connected to a drain of said first transistor and said first differential write line.
4. The apparatus according to claim 2, wherein said series combined resistive and capacitive load is connected between said source of said first transistor and said source of said second transistor.
5. The apparatus according to claim 1, wherein said apparatus is configured to allow a memory circuit to perform write operations at speeds that comply with the DDR4 SDRAM specification.
6. The apparatus according to claim 1, wherein said data bus is a DQ bus of a dual in-line memory module.
7. The apparatus according to claim 1, wherein said conditioning comprises a continuous time linear equalization (CTLE).
8. The apparatus according to claim 1, wherein said memory channel comprises a plurality of DRAM memory chips.
9. The apparatus according to claim 1, wherein (i) said apparatus implements a data buffer circuit and (ii) a plurality of said data buffer circuits are implemented on a DDR4 SDRAM memory module.
10. The apparatus according to claim 1, wherein a value of said series combined resistive and capacitive load is selected to control at least one of a slew rate and a small signal response.
11. The apparatus according to claim 1, wherein said apparatus reduces an area parameter for conditioning said write signals transmitted from said memory controller to said memory channel such that said apparatus has a smaller area than a data buffer circuit in DDR3 applications.
12. The apparatus according to claim 1, wherein said apparatus reduces a power consumption parameter for conditioning said write signals transmitted from said memory controller to said memory channel.
13. The apparatus according to claim 1, wherein said apparatus is configured to meet bandwidth and transient waveform specifications for DDR4 applications.
14. The apparatus according to claim 1, wherein said conditioning is configured to boost signals without increasing crosstalk.
15. The apparatus according to claim 14, wherein boosting signals without increasing crosstalk increases a signal to noise ratio.
16. The apparatus according to claim 1, wherein (i) said write signals are received by said apparatus as single-ended inputs and (ii) one side of said differential write signals is a reference signal having a constant voltage and internally generated by said apparatus.
17. The apparatus according to claim 1, wherein said apparatus is configured as a receiver equalization circuit with cross coupled transistors and RC impedance.
18. The apparatus according to claim 1, wherein said memory controller comprises a conditioner circuit configured to condition read signals received from said data bus, and said conditioning is implemented by (i) converting said read signals to a first differential read signal on a first differential read line and a second differential read signal on a second differential read line and (ii) connecting (a) a second negative impedance and (b) a second series combined resistive and capacitive load between said first and said second differential read lines.
19. A method for receiver equalization on differential write lines, comprising the steps of:
  buffering write signals presented on a data bus connected between a memory channel and a memory controller;
  buffering read signals presented on said data bus;
  conditioning said write signals by (i) converting said write signals to a first differential write signal on a first differential write line and a second differential write signal on a second differential write line and (ii) connecting (a) a negative impedance and (b) a series combined resistive and capacitive load between said first and said second differential write lines;
  converting said first and said second differential write signals to a single-ended write signal; and
  presenting said single-ended write signal to said memory channel.
20. An apparatus comprising:
  a first circuit configured to (a) buffer write signals presented on a data bus connected between a memory channel and a memory controller, (b) buffer read sig- nals presented on said data bus and (c) condition said write signals, wherein (i) said write signals are received as a first differential write signal on a first differential write line and a second differential write signal on a second differential write line and (ii) said conditioning is implemented by connecting (a) a negative impedance and (b) a series combined resistive and capacitive load between said first and said second differential write lines; and a second circuit configured to (a) convert said first and said second differential write signals to a single-ended write signal and (b) present said single-ended write signal to said memory channel.

\* \* \* \* \*